(12) United States Patent
Hwang et al.

(10) Patent No.: US 8,437,160 B2
(45) Date of Patent: May 7, 2013

(54) MULTI-STACK MEMORY DEVICE

(75) Inventors: In-jun Hwang, Yongin-si (KR);
Sung-hoon Choa, Seoul (KR);
Young-jin Cho, Suwon-si (KR);
Kee-won Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1378 days.

(21) Appl. No.: 11/978,583

(22) Filed: Oct. 30, 2007

(65) Prior Publication Data
US 2008/0137389 A1    Jun. 12, 2008

(30) Foreign Application Priority Data

Dec. 12, 2006 (KR) .................... 10-2006-0126408

(51) Int. Cl.
*G11C 5/02* (2006.01)

(52) U.S. Cl.
USPC ............... 365/51; 257/686; 257/777; 365/63; 365/80

(58) Field of Classification Search .................. None
See application file for complete search history.

(56) References Cited

U.S. PATENT DOCUMENTS

| | | | | |
|---|---|---|---|---|
| 6,754,124 B2* | 6/2004 | Seyyedy et al. | ............... | 365/214 |
| 6,879,508 B2 | 4/2005 | Tran | | |
| 6,879,515 B2* | 4/2005 | Yoda et al. | .................... | 365/158 |
| 6,885,573 B2 | 4/2005 | Sharma et al. | | |
| 6,898,132 B2 | 5/2005 | Parkin | | |
| 6,909,129 B2 | 6/2005 | Kim et al. | | |
| 7,291,878 B2* | 11/2007 | Stipe | ............................. | 257/296 |
| 7,315,470 B2 | 1/2008 | Parkin | | |
| 7,405,958 B2* | 7/2008 | Okazawa | ........................ | 365/66 |
| 2004/0251232 A1 | 12/2004 | Chen et al. | | |
| 2004/0257719 A1 | 12/2004 | Ohba et al. | | |
| 2006/0120132 A1 | 6/2006 | Parkin | | |
| 2006/0258089 A1* | 11/2006 | Chung-Zen | .................. | 438/257 |
| 2007/0198618 A1* | 8/2007 | Kim et al. | ..................... | 708/130 |

FOREIGN PATENT DOCUMENTS

| | | |
|---|---|---|
| EP | 1320102 A2 | 6/2003 |
| JP | 2001-217398 | 8/2001 |
| JP | 2003-346489 A | 12/2003 |
| JP | 2004-023062 | 1/2004 |
| JP | 2005-285475 | 9/2005 |
| JP | 2005-310829 | 11/2005 |
| KR | 1020040086690 A | 10/2004 |

OTHER PUBLICATIONS

English machine translation of JP2007-096119 retrieved from PAJ on Jun. 13, 2012.*

(Continued)

*Primary Examiner* — Alexander Sofocleous
(74) *Attorney, Agent, or Firm* — Harness, Dickey & Pierce, P.L.C.

(57) ABSTRACT

Provided is a multi-stack memory device that includes a storage unit group including a plurality of storage units that are vertically stacked and form a plurality of storage unit rows, and a plurality of transistors connected to the storage unit group, wherein the transistors that are connected to the storage units which are included in at least two rows of the plurality of the storage unit rows and are connected by a common wire. The common wire may be a gate line or a bit line.

41 Claims, 9 Drawing Sheets

OTHER PUBLICATIONS

Office Action dated Nov. 14, 2007 in corresponding Korean Patent Application No. 10-2006-0126408.
Chinese Office Action dated Apr. 13, 2010 in corresponding Chinese Application No. 200710084975.7, with English translation.
European Search Report dated Jul. 2, 2007 in corresponding European Application No. 07102158.8.
Japanese Office Action dated Mar. 13, 2012 issued in Japanese Application No. 2007-033805, with English translation.

* cited by examiner

MULTI-STACK MEMORY DEVICE

PRIORITY STATEMENT

This application claims priority under 35 U.S.C. §119 to Korean Patent Application No. 10-2006-0126408, filed on Dec. 12, 2006, in the Korean Intellectual Property Office (KIPO), the entire contents of which are incorporated herein by reference.

BACKGROUND

1. Field

Example embodiments relate to a semiconductor device. Other example embodiments relate to a multi-stack memory device.

2. Description of the Related Art

The integration density of a semiconductor device may be increased to a limit by reducing a line width because the line width below a critical value may not be realized due to the limitation of an exposure process. Also, when the line width of a storage node where data is stored is reduced below a critical value, the data retention characteristics of the storage node may be deteriorated. For example, in a storage node formed of a magnetic material having relatively small magnetic anisotropic energy, if the size of a minimum region where data is stored, for example, a bit size is reduced below a critical value, the thermal stability of the storage node may be reduced and the data retention characteristics may be deteriorated.

Therefore, a multi-stack memory device may have increased integration density by stacking storage nodes. Accordingly, the integration density may be increased without reducing the line width. This technique may be applied to various fields, e.g., a domain wall motion memory device, a resistive random access memory (RRAM) device and/or a flash memory device.

In such a multi-stack memory device, storage nodes stacked with a plurality of rows or a multi-structured wiring connected to the storage nodes may be respectively connected to a plurality of transistors formed on a substrate. In a domain wall motion memory device field, the domain wall movement of a particular storage node may be possible by the transistor. Also, in a RRAM device and the flash memory device fields, random access of data may be possible by the transistors.

However, due to structural complexity, connecting the storage nodes or the wirings to the transistors and maintaining a pitch of the storage nodes or the wirings of about 2F (F=minimum width) may be difficult. When the storage nodes or the wirings are connected to the transistors using a conventional method, a conductive plug may be disposed between every storage node or wiring, the pitch of the storage nodes or the wirings may increase to about 4F. Therefore, in the conventional multi-stack memory device, increasing the recording density per unit area as long as the pitch of the storage nodes or the wirings, and not reduced below about 4F, may be difficult.

SUMMARY

Example embodiments provide a multi-stack memory device including a pitch of stacked storage nodes or wirings that is about 2F or less.

According to example embodiments, a multi-stack memory device may include a storage unit group including a plurality of storage units that are vertically stacked and form a plurality of storage unit rows, and a plurality of transistors connected to the storage unit group, wherein the transistors that are connected to the storage units which are included in at least two rows of the plurality of the storage unit rows are connected by a common wire.

The common wire may be a gate line or a bit line. The storage unit rows of the storage unit group may be grouped into storage unit groups each having two storage unit rows, and the plurality of storage units that belong to each of the storage unit groups are connected to the transistors that are connected by the common wire. The storage unit groups may be storage node groups having domain wall movement characteristics.

The storage node group may include first and second storage node groups that include a plurality of vertically stacked storage nodes, and the storage nodes of the first and second storage node groups may be respectively connected to the transistors. The storage unit group may be a first storage unit group and may further include a second storage unit group having a plurality of storage unit columns which are perpendicular to the first storage unit group, and the storage units of the first storage unit group and the storage units of the second storage unit group may be alternately stacked. The storage unit may be a resistance change layer. Each of the columns may include a plurality of vertically stacked storage units. The storage units of the first storage unit group and the transistors may be connected by conductive layers and conductive plugs. Diodes may be formed between the conductive layers and the storage units of the second storage unit group.

A wire may be formed under each of lowermost storage units of the storage units that belong to the first and second storage unit groups, and a diode may be formed between the wire and the lowermost storage units. The common wire that connects the transistors may be a gate line or a bit line. The storage units including at least two storage unit columns of the plurality of storage unit columns may be connected to different transistors, and the different transistors may be connected by a different common wire. The different common wire may be a gate line and/or a bit line. The multi-stack memory device may further include a data group including a plurality of data lines are vertically stacked and form a plurality of data line columns which are perpendicular to the storage unit group, wherein the storage units of the storage unit group and the data lines of the data line group are alternately stacked.

The storage units and the transistors may be connected by word lines formed on the storage units and conductive plugs, or by the word lines formed on the storage units, conductive plugs, and conductive layers. The common wire that connects the transistors may be a gate line or a bit line. The data lines including at least two data line columns of the plurality of data line columns may be connected to different transistors and the different transistors may be connected by a different common wire.

The different common wire that connects the transistors may be a gate line or a bit line. The storage units may be longer in an upward direction or in a downward direction. The data lines may be longer in an upward direction or in a downward direction. The word lines may be longer in an upward direction or in a downward direction. The storage unit may have a width of about 1F, and source and drain regions of the transistor may have a dimension of about 1F×about 1F.

At least some of the storage units may be connected to corresponding transistors by at least one conductive layer and at least two conductive plugs. The conductive layer may have a straight line shape or a bent shape. Some of the storage units may be connected to corresponding transistors by a single conductive plug. The storage unit may have a width of about 1F, and a gap between the storage units may be about 1F. The common wire may be a common bit line, the common bit line may include a first portion having a straight line shape and second portions extending from the first portion in a perpendicular direction to the first portion, and the number of the second portions may be the same as the number of transistors. The common wire may be a common bit line, and the common bit line may have a winding shape.

According to example embodiments, maintaining a gap of about 1F between the storage nodes or wirings, and thereby increasing the recording density of a multi-stack memory device, may be possible.

BRIEF DESCRIPTION OF THE DRAWINGS

Example embodiments will be more clearly understood from the following detailed description taken in conjunction with the accompanying drawings. FIGS. 1A-6B represent non-limiting, example embodiments as described herein.

FIG. 1A is a perspective view of a multi-stack memory device according to example embodiments;

FIGS. 3-5 are perspective views of multi-stack memory devices according to example embodiments;

FIG. 6B is a perspective view of a multi-stack memory device that includes the cross-section of a-a' of FIG. 6A, according to example embodiments.

Figure 1A:
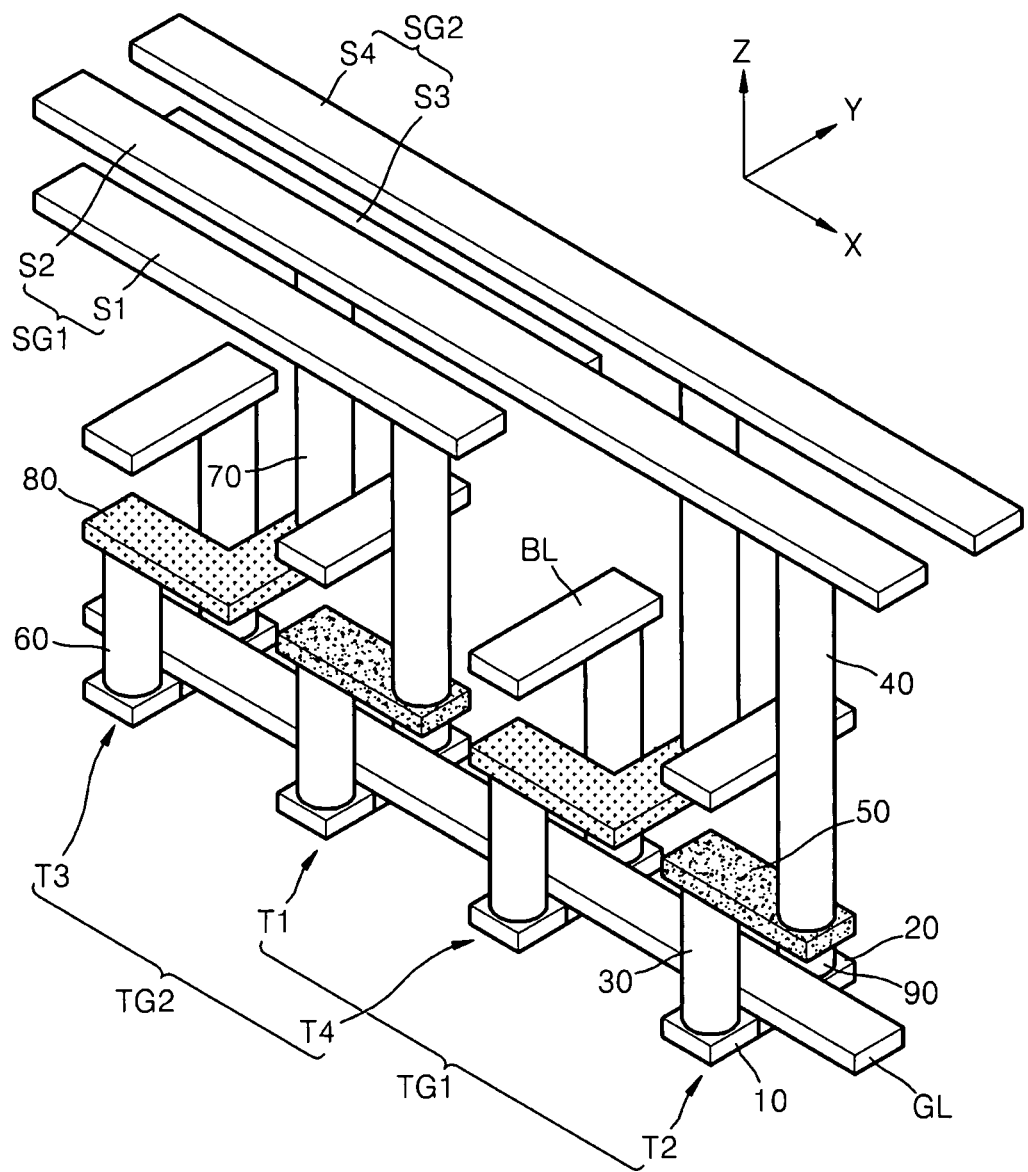

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings in which example embodiments are shown. In the drawings, the thicknesses of layers and regions are exaggerated for clarity. Example embodiments may, however, be embodied in many different forms and should not be construed as being limited to the embodiments set forth herein. Rather, these embodiments are provided so that this disclosure will be thorough and complete, and will fully convey the scope of example embodiments to those skilled in the art. Like numbers refer to like elements throughout the specification.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1A is a perspective view of a multi-stack memory device according to example embodiments. Referring to FIG. 1A, the memory device may include first and second storage node groups SG1 and SG2 separated a predetermined or given distance from each other in a Y direction. The first and second storage node groups SG1 and SG2 may be storage unit groups and may have domain wall movement characteristics. The first storage node group SG1 may include first and second storage nodes S1 and S2 sequentially stacked in a Z direction. The second storage node group SG2 may include third and fourth storage nodes S3 and S4 sequentially stacked in the Z direction. The second and fourth storage nodes S2 and S4 may have lengths greater than the lengths of the first and third storage nodes S1 and S3. The first through fourth storage nodes, S1-S4, respectively, may be magnetic layers having a plurality of magnetic domains.

Domain walls of the magnetic layers may migrate by a current applied to the first through the fourth storage nodes S1-S4. The current may be applied via transistors, and the transistors may be respectively connected to at least one of both ends of the magnetic layers. Although not shown, a writing head for recording data and a reading head for reading data may be included on a predetermined or given region of the magnetic layer. The writing head and the reading head may be a tunnel magnetoresistance (TMR) head, a giant magnetoresistance (GMR) head and/or other heads.

Storage nodes of the first storage node group SG1 and transistors of a first transistor group TG1 may be connected in a one-to-one manner, and storage nodes of the second storage node group SG2 and transistors of a second transistor group TG2 may be connected in a one-to-one manner. The transistor of the first transistor group TG1 and the transistor of the second transistor group TG2 may be alternately installed. The first transistor group TG1 may include a first transistor T1 and a second transistor T2, and the second transistor group TG2 may include a third transistor T3 and a fourth transistor T4. The first through fourth transistors T1-T4 may include a gate line GL formed on a substrate (not shown) and first and second dopant regions 10 and 20 formed on both sides of the gate line GL. One of the dopant regions 10 and 20 may be a source region, and the other may be a drain region. The gate line GL may be formed parallel to the first through fourth storage nodes S1-S4 between the first and second storage node groups SG1 and SG2.

The first and second storage nodes S1 and S2 and the first dopant region 10 of the first and second transistors T1 and T2 may be respectively connected by first and second conductive plugs 30 and 40 and first conductive pads 50. The first conductive pad 50 may horizontally connect the first and second conductive plugs 30 and 40, and may have a straight line shape. The third and fourth storage nodes S3 and S4 and the first dopant region 10 of the third and fourth transistors T3 and T4 may be respectively connected by third and fourth conductive plugs 60 and 70 and second conductive pads 80.

The second conductive pad 80 may horizontally connect the third and fourth conductive plugs 60 and 70, and may have a bending shape. Bit lines BL may pass over the second dopant regions 20 of the first through fourth transistors T1-T4. The second dopant regions 20 and the bit lines BL may be connected by fifth conductive plugs 90. The bit lines BL may be disposed below the first and second storage node groups SG1 and SG2, and may be formed parallel to the first through fourth storage nodes S1-S4. Domain walls of any one or more of the storage nodes may selectively migrate by applying a predetermined or given voltage to the predetermined or given bit line BL and the gate line GL.

Figure 1B:
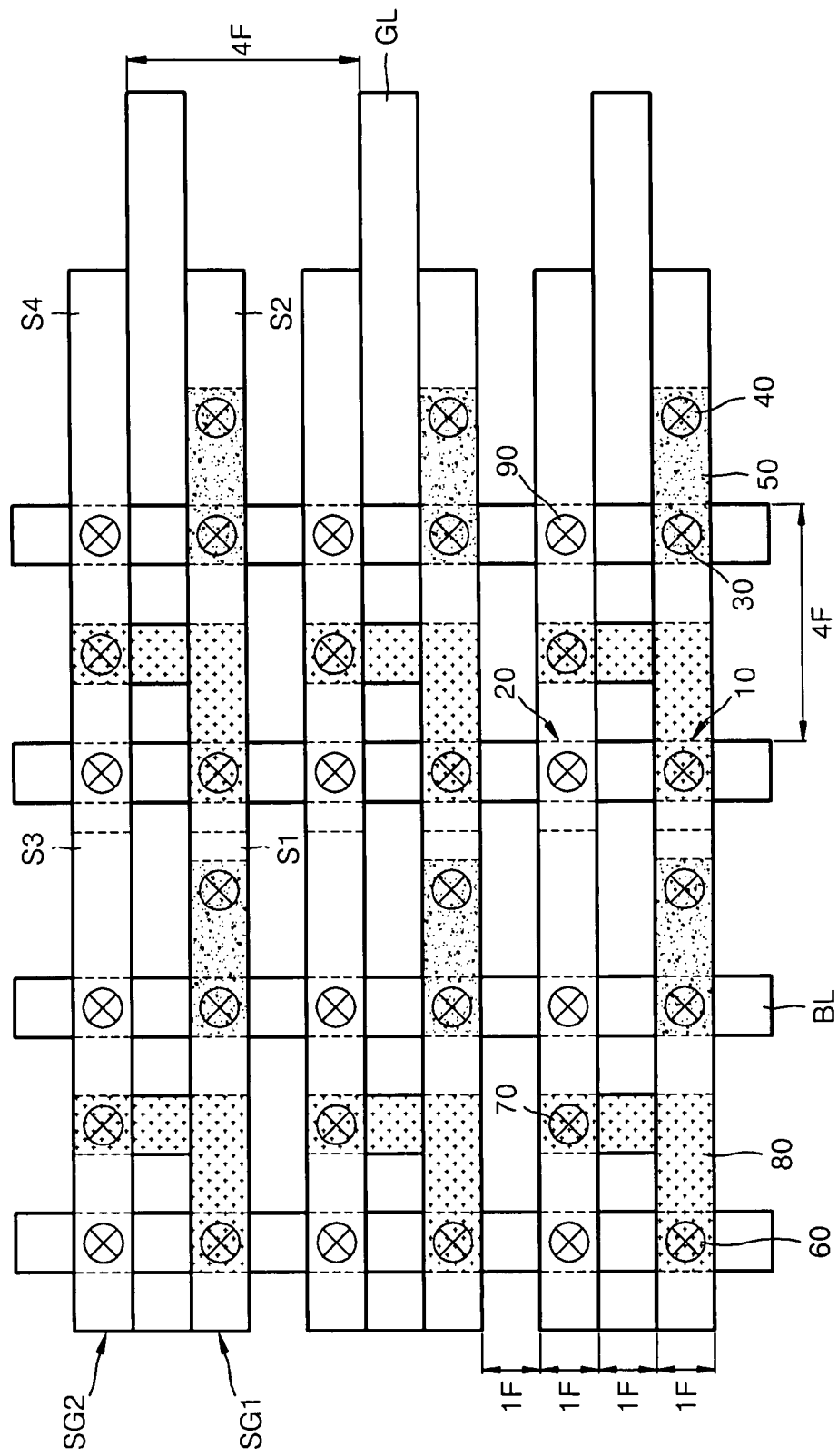
FIG. 1B is a layout showing a plane structure of a multi-stack memory device according to example embodiments.

In FIG. 1A, the first and second storage node groups SG1 and SG2, respectively, may include more than two storage nodes. Also, the structure depicted in FIG. 1A may be repeated in the Y direction. FIG. 1B is a layout showing a plane structure of a multi-stack memory device, in which the structure of FIG. 1A is repeated three times in the Y direction, for example, in a direction perpendicular to the gate line GL, according to example embodiments. Referring to FIG. 1B, a gap between the first and second storage node groups SG1 and SG2 may be about 1F, a pitch of the gate line GL may be about 4F, and a pitch of the bit line BL may be about 4F.

In the memory device having the above structure according to example embodiments, the first and second transistor groups TG1 and TG2 may be connected by a common gate line GL. In other words, the first and second transistor groups TG1 and TG2 connected to the first and second storage node groups SG1 and SG2 may share one gate line GL. There may be no conductive plug between the first and second storage node groups SG1 and SG2. Therefore, a gap between the first and second storage node groups SG1 and SG2 may be equal to a width of the first or second or storage node groups SG1 or SG2. For example, assuming that the width of the first or second storage node groups SG1 or SG2 is about 1F, the gap of the first or second storage node groups SG1 or SG2 may be about 1F. The gap between the first and second storage node groups SG1 and SG2 may be maintained at about 1F, which denotes that a recording density of the multi-stack memory device having a predetermined or given bit size may be maximized or increased.

Figure 2A:
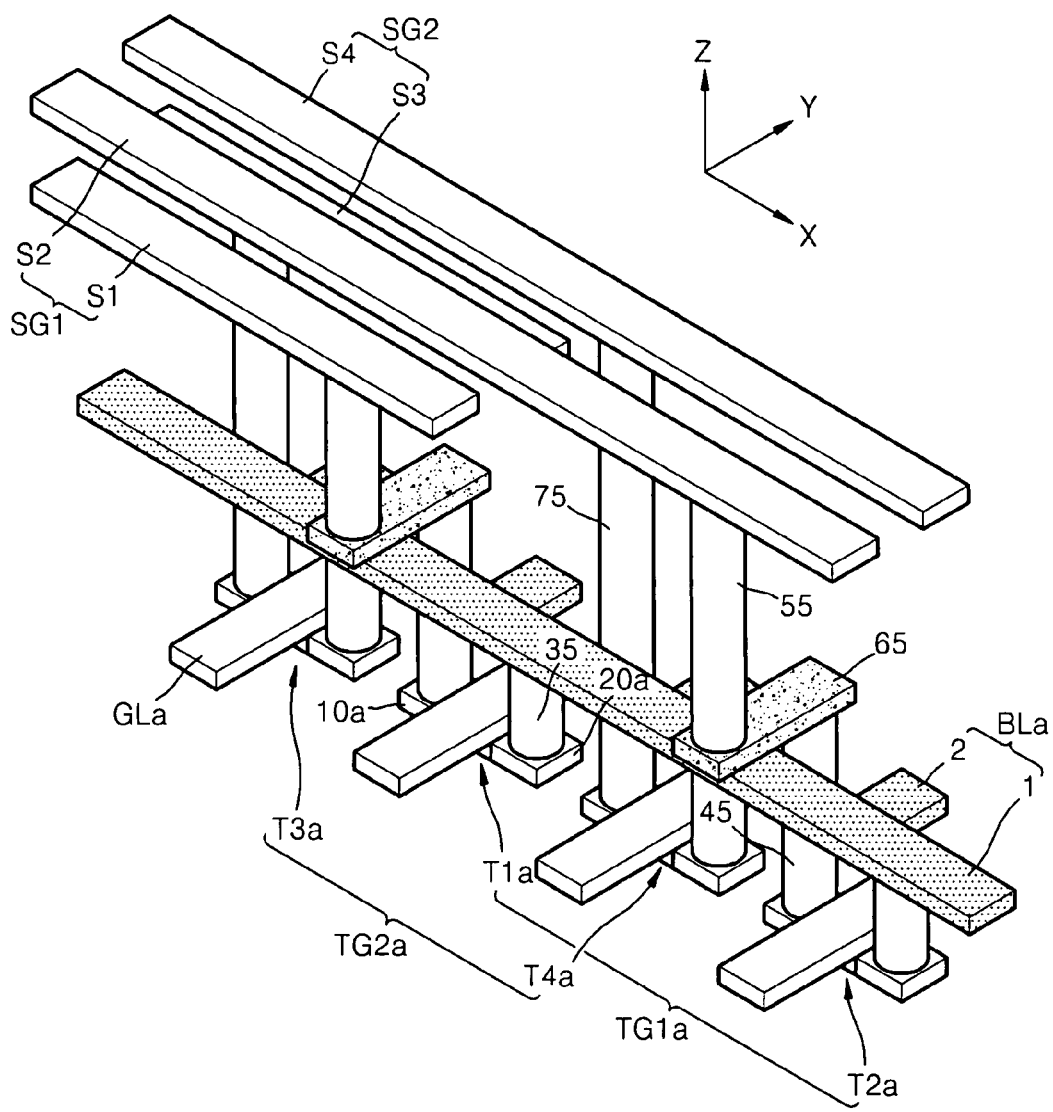
FIG. 2A is a perspective view of a multi-stack memory device according to example embodiments.

FIG. 2A is a perspective view of a multi-stack memory device according to example embodiments. The memory device illustrated in FIG. 2A is a modified version of the memory device illustrated in FIG. 1A with regard to the structure of the first through fourth transistors T1-T4, the connection structure between the first through fourth transistors T1-T4 and the first through fourth storage nodes S1-S4, and the structure of the bit lines BL. Referring to FIG. 2A, gate lines GLa of the memory device according to example embodiments may be formed in a direction perpendicular to first through fourth storage nodes S1-S4. Accordingly, the locations of first and second dopant regions 10a and 20a in the memory device illustrated in FIG. 2A may be different from the locations of the first and second dopant regions 10 and 20 in the memory device illustrated in FIG. 1A.

A bit line BLa of the memory device may include a straight line shape with the first portion 1 formed below the region between the first and second storage node groups SG1 and SG2 and second portions 2 that extend perpendicularly from the first portion 1. The second portions 2 may be connected to the second dopant regions 20a, and the number of the second portions 2 may be equal to the number of the transistors of the first and second transistor groups TG1a and TG2a. The second portions 2 may be connected to the second dopant regions 10a by sixth conductive plugs 35. The first and second storage nodes S1 and S2 and the first dopant regions 10a of the first and second transistors T1a and T2a may be connected by seventh conductive plugs 45, eighth conductive plugs 55, and third conductive pads 65 that horizontally connect the seventh and eighth conductive plugs 45 and 55. The third and fourth storage nodes S1-S4 and the first dopant regions 10a of the third and fourth transistors T3a through T4a may be connected by ninth conductive plugs 75.

Figure 2B:
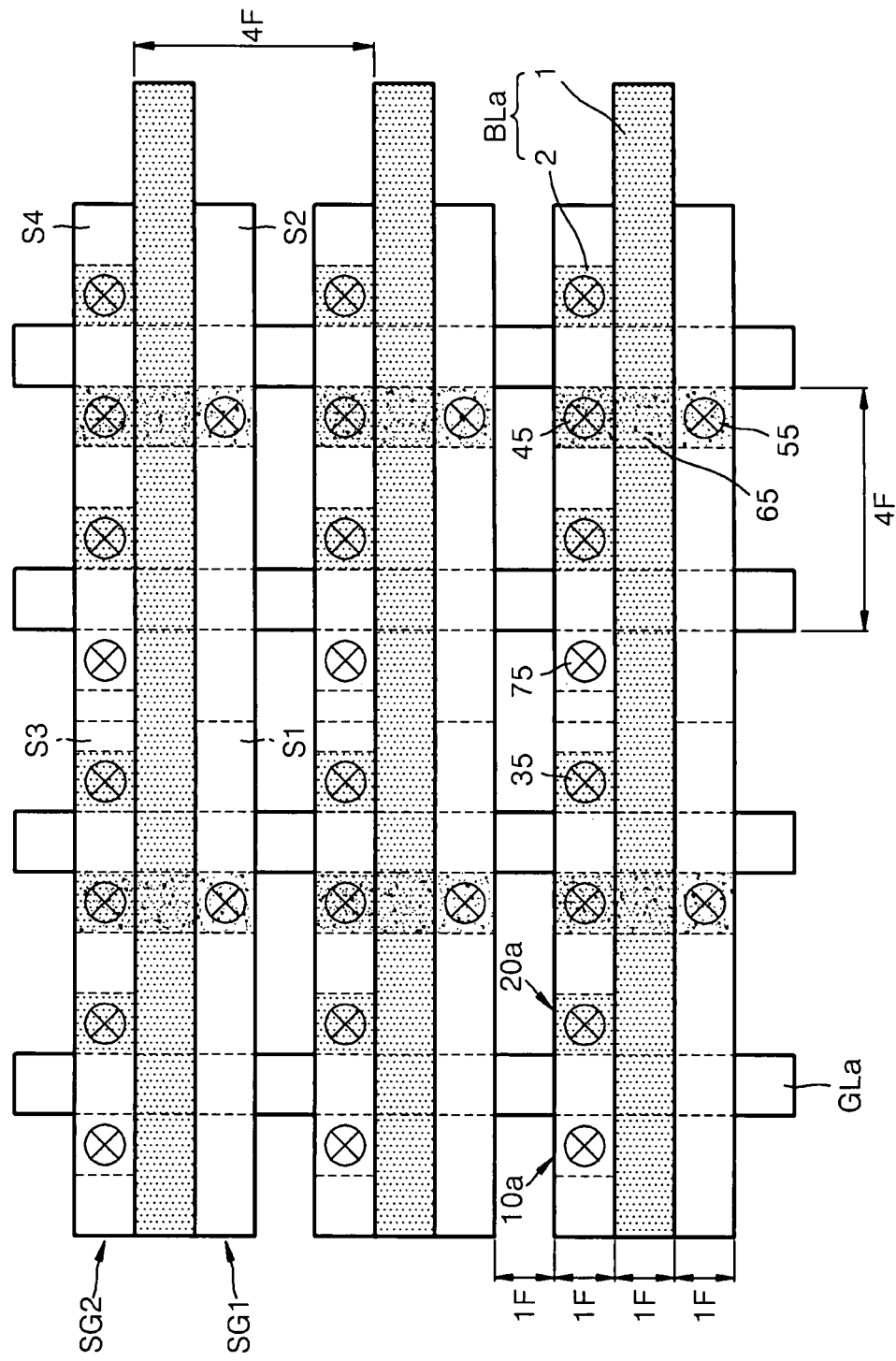
FIG. 2B is a layout showing a plane structure of a multi-stack memory device according to example embodiments.

FIG. 2B is a layout showing a plane structure of a multi-stack memory device, in which the structure of FIG. 2A is repeated three times in the Y direction, for example, in a direction perpendicular to the first portion 1 of the bit line BLa, according to example embodiments. Referring to FIG. 2B, a gap between the first and second storage node groups SG1 and SG2 may be about 1F, a pitch of the gate line GLa may be about 4F, and a pitch of the bit line BLa may be about 4F.

In the memory device having the above structure according to example embodiments, the first and second transistor groups TG1a and TG2a may be connected by common bit lines BLa. In other words, the first and second transistor groups TG1a and TG2a connected to the first and second storage node groups SG1 and SG2 may share one bit line BLa. There may be no conductive plug between the first and second storage node groups SG1 and SG2. Therefore, a gap between the first and second storage node groups SG1 and SG2 may be equal to a width of the first or second storage node groups SG1 or SG2.

Figure 3:
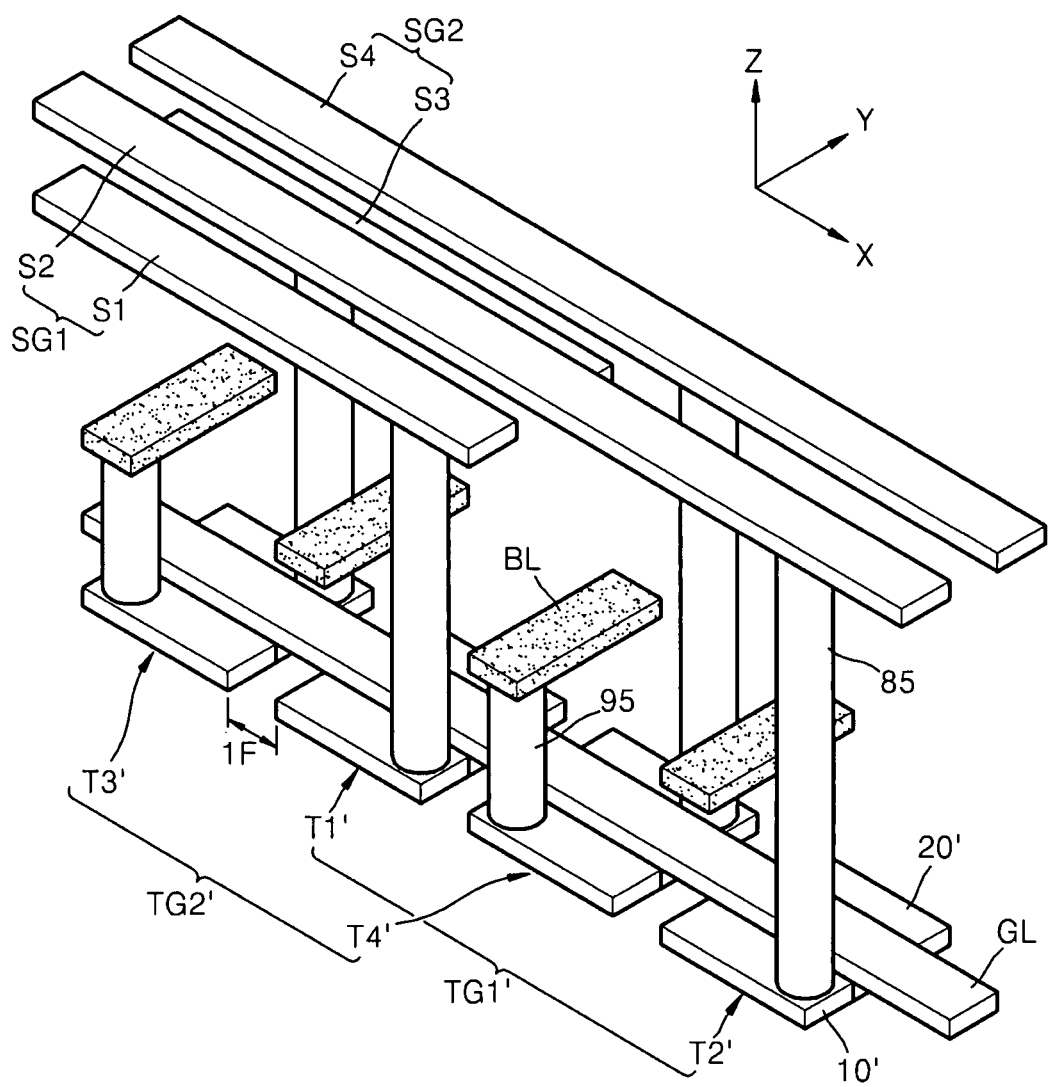

FIG. 3 is a perspective view of a multi-stack memory device according to example embodiments. The memory device illustrated in FIG. 3 according to example embodiments may be a modified version of the memory device illustrated in FIG. 1A. The first and second dopant regions 10 and 20 in the memory device illustrated in FIG. 1A may have a size of about 1F×about 1F, however, first and second dopant regions 10' and 20' in the memory device illustrated in FIG. 3 may have a size of about 1F×about 3F. About 3F may be a length of the first and second dopant regions 10' and 20' parallel to the first and second storage node groups SG1 and SG2.

Because the memory device includes the first and second dopant regions 10' and 20' having a size of about 1F×about 3F, the first through fourth storage nodes S1-S4 and the first through fourth transistors T1' through T4' may be connected by only tenth conductive plugs 85 without the conductive pads. Lower parts of the tenth conductive plugs 85 may be connected to one of the first and second dopant regions 10' and 20'. Eleventh conductive plugs 95 may be connected to one of the first and second dopant regions 10' and 20' that is not connected to the tenth conductive plugs 85. The eleventh conductive plugs 95 may connect the bit line BL and the first and second dopant regions 10' and 20' that are not connected to the tenth conductive plugs 85. The tenth and eleventh conductive plugs 85 and 95 may be formed in different dopant regions in the same transistor. Reference numerals TG1' and TG2' indicate first and second transistor groups included in the memory device according to example embodiments.

Figure 4:
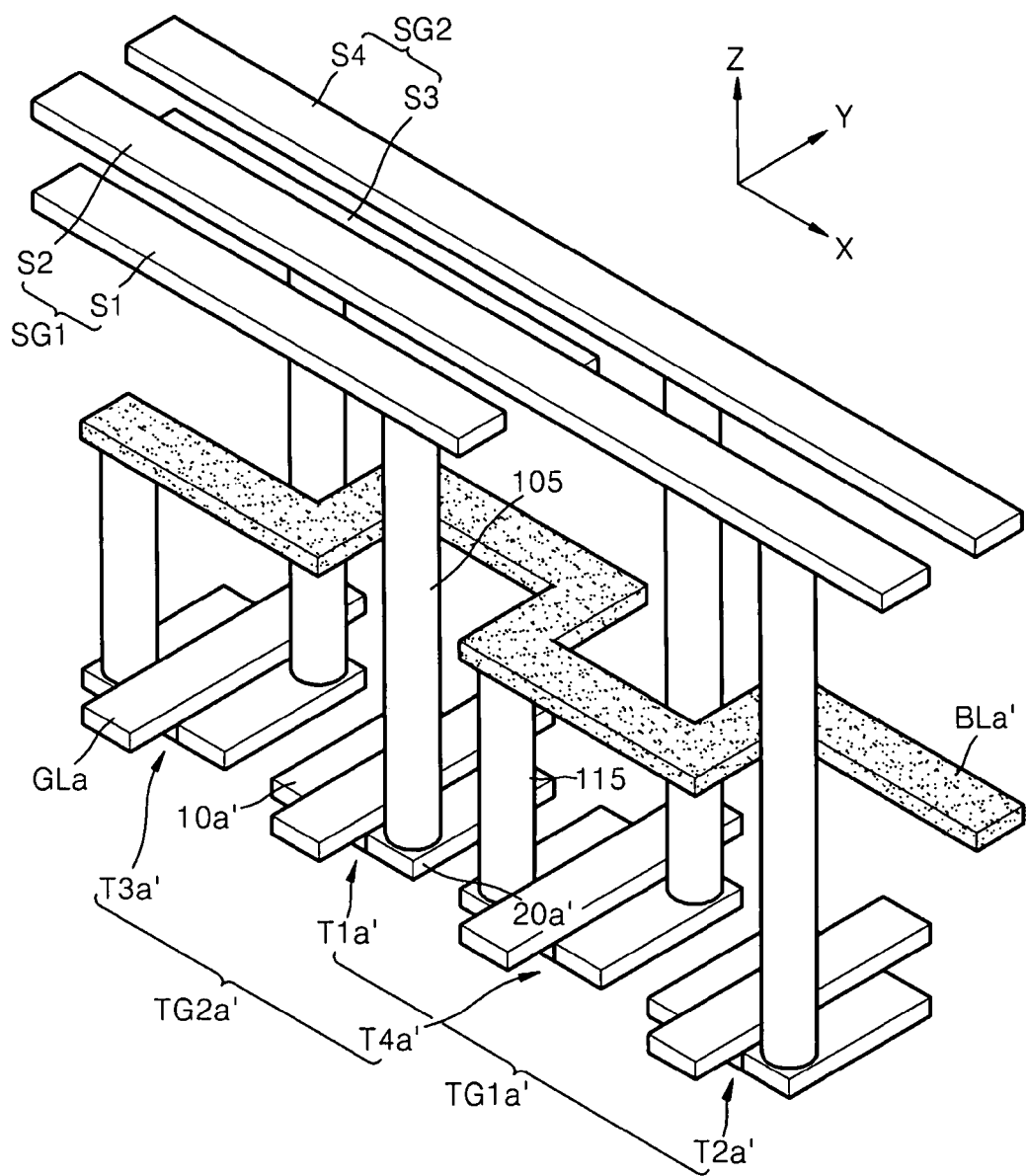

FIG. 4 is a perspective view of a multi-stack memory device according to example embodiments. The memory device illustrated in FIG. 4 according to example embodiments is a modified version of the memory device illustrated in FIG. 2A. The first and second dopant regions 10a and 20a in the memory device illustrated in FIG. 2A may have a size of about 1F×about 1F, however, first and second dopant regions 10a' and 20a' in the memory device illustrated in FIG. 4 may have a size of about 1F×about 3F. About 3F may be a length of the first and second dopant regions 10a' and 20a' perpendicular to the first and second storage node groups SG1 and SG2.

Because the memory device includes the first and second dopant regions 10a' and 20a' having a size of about 1F×about 3F, the first through fourth storage nodes S1-S4 and first through fourth transistors T1a' through T4a' may be connected by twelfth conductive plugs 105 without the conductive pads. The twelfth conductive plugs 105 may be formed on an edge of the first dopant region 10a' or second dopant region 20a'. Thirteenth conductive plugs 115 may be formed on the other edges of the first dopant region 10a' or second dopant region 20a'. The twelfth and thirteenth conductive plugs 105 and 115 in the same transistor may be formed in different dopant regions. A bit line BLa' having a curved shape, for example, a winding shape, which connects the thirteenth conductive plugs 115, may be formed on the thirteenth conductive plugs 115.

Figure 5:
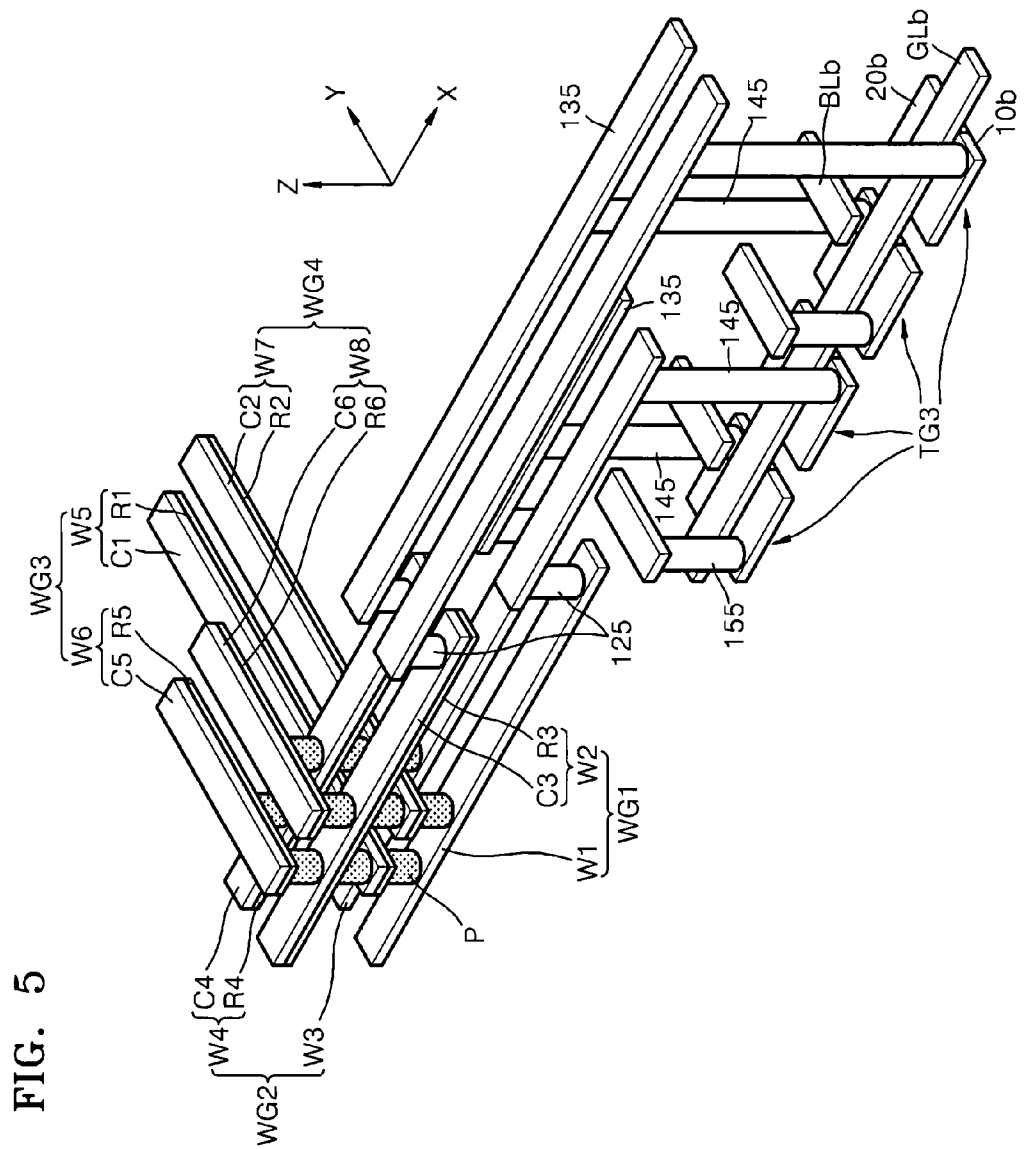
Figure 6A:
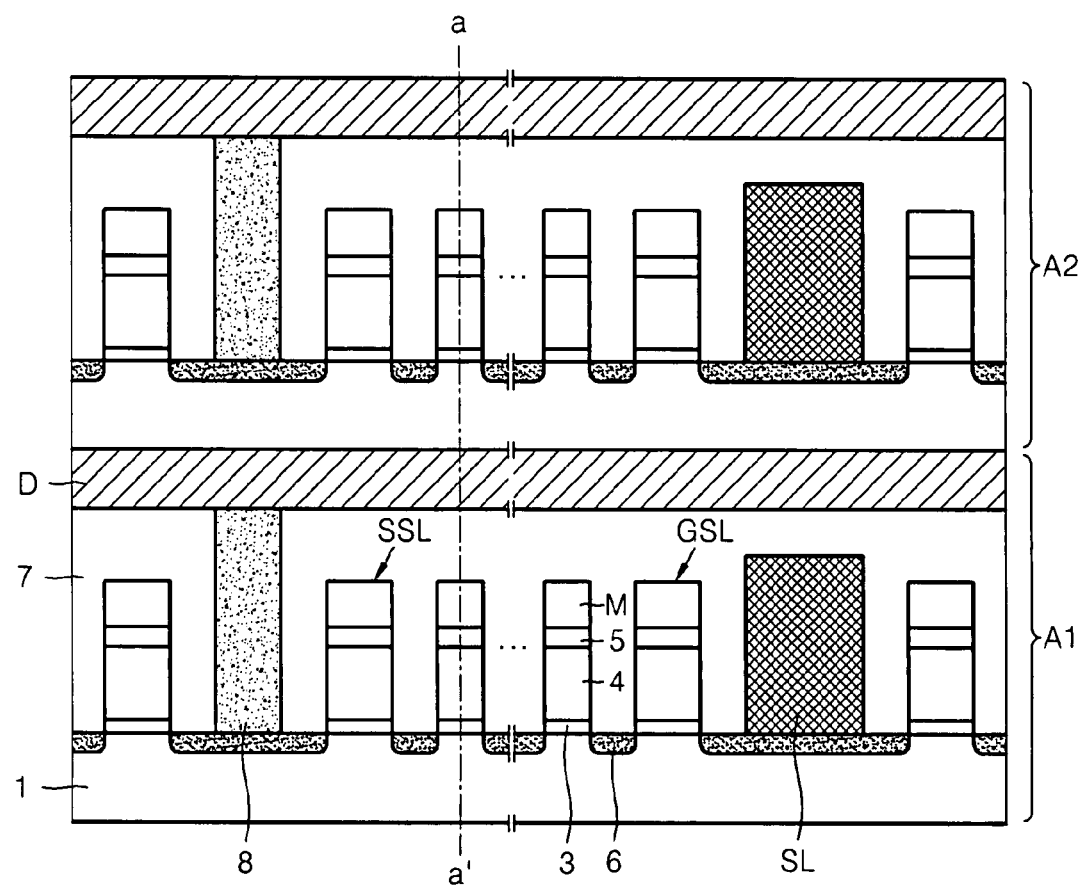
FIG. 6A is a cross-sectional view of a multi-stack memory device according to example embodiments.
Figure 6B:
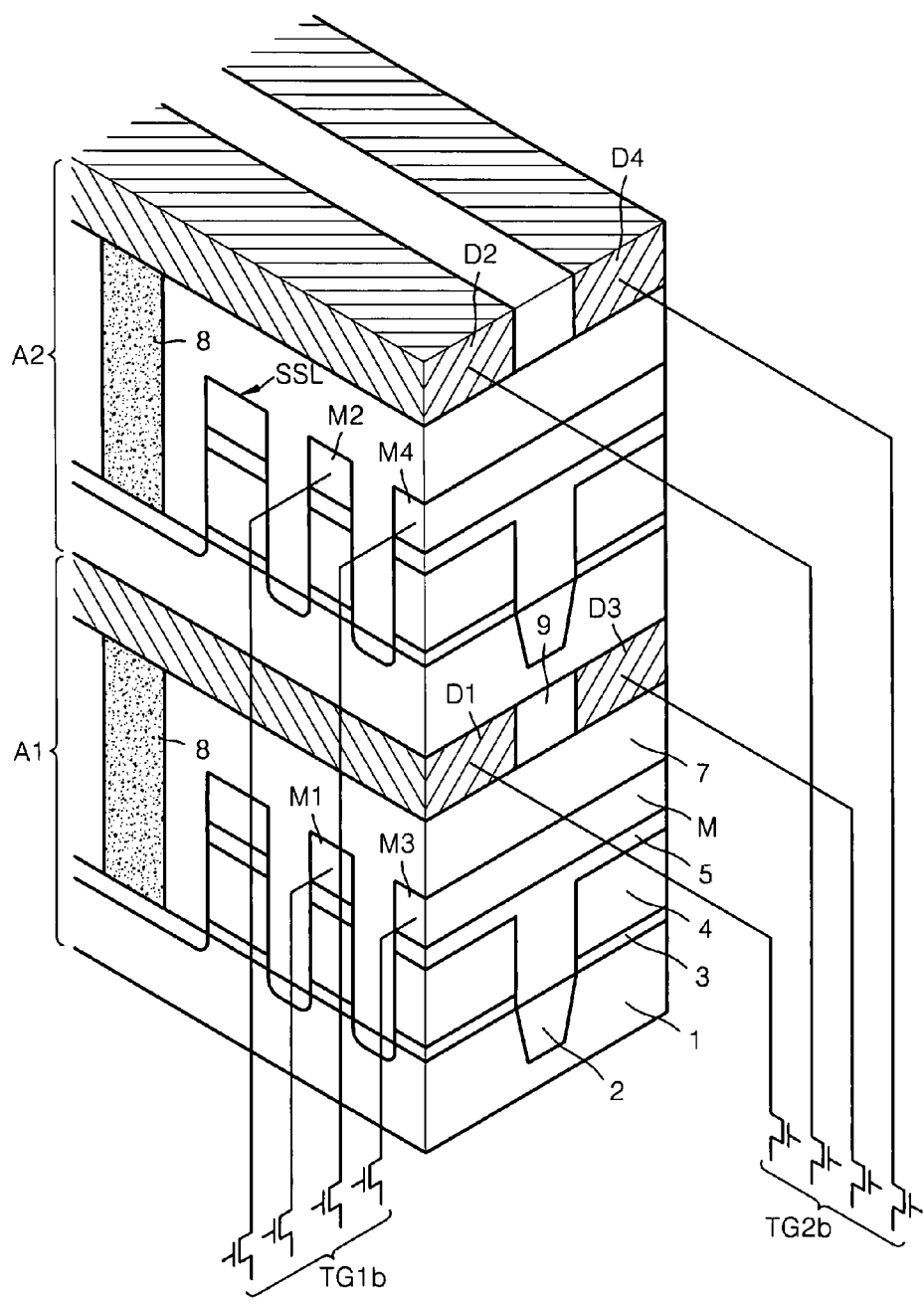

The memory devices according to example embodiments may be domain wall motion memory devices. Example embodiments may be applied not only to the domain wall motion memory device, but also to various different non-volatile memory devices including multilayer crosspoint RRAM devices and multi-stack flash memory devices. FIG. 5 is a perspective view of a multilayer crosspoint RRAM device to which example embodiments are applied, and FIGS. 6A and 6B are respectively a cross-sectional view and a perspective view of a multi-stack flash memory device to which example embodiments are applied. Other memory devices according to example embodiments will now described with reference to FIGS. 5, 6A, and 6B.

FIG. 5 is a perspective view of a multi-stack memory device according to example embodiments. Referring to FIG. 5, the memory device according to example embodiments may include first and second wire groups WG1 and WG2 separated a predetermined or given distance from each other in a Y direction. The first wire group WG1 may include first and second wires W1 and W2 stacked in a Z direction, for example, a vertical direction. The second wire group WG2 may include third and fourth wires W3 and W4 stacked in the Z direction. The first and third wires W1 and W3 may be formed longer than the second and fourth wires W2 and W4.

Third and fourth wire groups WG3 and WG4 perpendicularly crossing the first and second wire groups WG1 and WG2 may be formed. The wires belonging to the first and second wire groups WG1 and WG2 and wires belonging to the third and fourth wire groups WG3 and WG4 may be alternately stacked and separated by a predetermined or given distance from each other. The third wire group WG3 may include fifth and sixth wires W5 and W6 stacked in the Z direction, for example, the vertical direction. The fourth wire group WG4 may include seventh and eighth wires W7 and W8 stacked in the Z direction. The fifth and seventh wires W5 and W7 may be formed longer than the sixth and eighth wires W6 and W8.

Plug type structures P having diodes may be formed at crossing points between the first and second wire groups WG1 and WG2 and the third and fourth wire groups WG3 and WG4. Each of the plug type structures P may be a structure including a lower conductive layer, a PN diode, and an upper conductive layer that are sequentially stacked. The lowermost wires (the first and third wires) of the first through fourth wire groups WG1 through WG4 may be single conductive layers, and the rest of the wires may have a stacked structure including a resistance change layer and a conductive layer that are sequentially stacked. Reference numerals R1-R6 indicate first through sixth resistance change layers, and reference numerals C1-C6 indicate first through sixth conductive layers. Predetermined or given data may be recorded in the first through sixth resistance change layers R1-R6 by applying a predetermined or given voltage to the first through sixth resistance change layers R1-R6. A particular resistance change layer, in which the predetermined or given data is recorded, may be selected by a transistor connected to the first through eighth wires W1 and W8.

Of the first through eighth wires W1 and W8, each of the wires of the first and second wire groups WG1 and WG2 may be connected to third transistor groups TG3 which are connected by a common gate line or a common bit line. The connection in this manner may be similar to the connection between the first and second storage node groups SG1 and SG2 and the first and the second transistor groups TG1 and TG2 of the memory devices according to example embodiments. However, a difference in the memory device illustrated in FIG. 5 is that, because upper surfaces of the first and second wire groups WG1 and WG2 may be connected to the third transistor groups TG3, fourteenth conductive plugs 125 may be formed on upper surfaces of the first through fourth wires W1 and W4, and fourth conductive pads 135 that contact the fourteenth conductive plugs 125 may be formed. The fourth conductive pads 135 formed on an upper side may be longer that the fourth conductive pads 135 formed on a lower side.

Fifteenth conductive plugs 145 may be formed on lower surfaces of the fourth conductive pads 135, and may be connected to ends of the first dopant region 10b or the second dopant region 20b of the third transistor groups TG3. Sixteenth conductive plugs 155 may be formed on the other ends of the first dopant region 10b or the second dopant region 20b of the third transistor groups TG3, and bit lines BLb connected to each of the sixteenth conductive plugs 155 may be formed on the sixteenth conductive plugs 155. In FIG. 5, the third transistor groups TG3 having the same structure as the first and second transistor groups TG1' and TG2' described with reference to FIG. 3 are depicted.

However, the structure of the third transistor groups TG3 may be transformed to the first and second transistor groups TG1, TG2, TG1a, TG2a, TG1a', and TG2a' depicted in FIGS. 1A, 2A, and 4. As a result of the transformation, the connection structure between the fourth conductive pads 135 and the third transistor groups TG3 may be changed. For example, the connection structure between the fourth conductive pads 135 and the third transistor groups TG3 may have the same connection structure between the first and second storage node groups SG1 and SG2 and the first and second transistor groups TG1, TG2, TG1a, TG2a, TG1a', and TG2a' depicted in FIGS. 1A, 2A, and 4. Reference numeral GLb indicates a common gate line of the third transistor groups TG3.

Although not shown, each of the wires of the third and fourth wire groups WG3 and WG4 may be connected to fourth transistor groups (not shown) connected by a common gate line or a common bit line. The fourth transistor groups may have the same structure as the third transistor groups TG3, and the connection structure between the third and fourth wire groups WG3 and WG4 and the fourth transistor groups (not shown) may be the same as the connection structure between the first and second wire groups WG1 and WG2 and the third transistor groups TG3. According to example embodiments, the gap between the first and second wire groups WG1 and WG2 may be the same as the width of the first and second wire groups WG1 and WG2, and the gap between the third and fourth wire groups WG3 and WG4 may be the same as the width of the third or fourth wire groups WG3 or WG4.

FIG. 6A is a cross-sectional view of a multi-stack memory device according to example embodiments, and FIG. 6B is a perspective view of the multi-stack memory device that includes the cross-section along line a-a' of FIG. 6A, according to example embodiments. Referring to FIGS. 6A and 6B, the memory device according to example embodiments may include sequentially stacked first and second stack structures A1 and A2. The first and second stack structures A1 and A2 may have the same structure. The first stack structure A1 may include a substrate 1 in which a trench type device isolation film 2 that defines an active area is formed. A plurality of word lines M may be formed above the substrate 1. A floating gate 4 may be formed on a lower side of the word lines M.

A blocking insulating layer 5 may be formed between the word lines M and the floating gate 4, and a tunnel insulating layer 3 may be formed between the floating gate 4 and the substrate 1. A ground selection line GSL may be formed in a position separated a predetermined or given distance from the far right sided word line M, and a string selection line SSL may be formed in a position separated a predetermined or given distance from the far left sided word line M. Dopant regions 6 may be formed between the word line M and the ground selection line GSL, between the word line M and the string selection line SSL, and between the word lines M. A source line SL may be formed on the dopant region 6 on the right side of the ground selection line GSL. A first interlayer insulating layer 7 may be formed to cover the word lines M, the ground selection line GSL, the string selection line SSL, and the source line SL. The first interlayer insulating layer 7 may include a hole that exposes the dopant region 6 on the left side of the string selection line SSL, and a seventeenth conductive plug 8 may be formed in the hole. A plurality of data lines D, which contact the seventeenth conductive plug 8 and are formed perpendicularly to the word lines M, may be formed on the first interlayer insulating layer 7. A second interlayer insulating layer 9 may be formed on the first interlayer insulating layer 7 between the data lines D. The number of word lines M and the data lines D may be increased by more than is illustrated in the drawings, and also, the structure identical to the first stack structure A1 may be stacked twice or more.

Referring to FIG. 6B, the word lines M vertically stacked may be grouped into a first word line group MG1 and a second word line group MG2. M1 and M2 may be word lines belonging to the first word line group MG1, and M3 and M4 may be word lines belonging to the second word line group MG2. The vertically stacked data lines may be grouped into a first data line group DG1 and a second data line group DG2. In FIG. 6B, D1 and D2 may be data lines belonging to the first data line group DG1, and D3 and D4 may be data lines belonging to the second data line group DG2. Although not shown in FIGS. 6A and 6B, the word lines M of the first and second word line groups MG1 and MG2 and the data lines of the first and second data line groups DG1 and DG2 may be longer in a downward direction or an upward direction. Each of the word lines M of the first and second word line groups MG1 and MG2 may be connected to a first transistor group TG1b connected by a common gate line or a common bit line. Each of the data lines D of the first and second data line groups DG1 and DG2 may be connected to a second transistor group TG2b connected by a common gate line or a common bit line.

Transistors of the first and second transistor groups TG1b and TG2b may have the same structure as the transistors of the first and second transistor groups TG1, TG2, TG1a, TG2a, TG1', TG2', TG1a', and TG2a' depicted in FIGS. 1A, 2A, 3, and 4. The connection structure between the transistors of the first and second transistor groups TG1b and TG2b and the word lines of the first and second word line groups MG1 and MG2 or the data lines of the first and second data line groups DG1 and DG2 may be determined according to the structure of the transistors of the first and second transistor groups TG1b and TG2b. For example, the connection structure between the word lines of the first and second word line groups MG1 and MG2 or the data lines of the first and second data line groups DG1 and DG2 and the transistors of the first and second transistor groups TG1b and TG2b may have the same connection structure between the first and second storage node groups SG1 and SG2 and the first and second transistor groups TG1, TG2, TG1a, TG2a, TG1', TG2', TG1a', and TG2a' depicted in FIGS. 1A, 2A, 3, and 4.

As described above, according to example embodiments, storage nodes or wirings may be connected to a plurality of transistors while maintaining a gap of about 1F between the storage nodes or wirings stacked with a plurality of rows. Accordingly, the use of example embodiments may increase the recording density of a multi-stack memory device having a predetermined or given bit size.

While example embodiments have been particularly shown and described with reference to embodiments thereof, it should not be construed as being limited to the embodiments set forth herein. For example, in FIG. 1A, the storage nodes of more than two storage node groups may be connected to transistors which are connected by a common wire (a common gate line or a common bit line). Therefore, the scope of example embodiments is defined by the appended claims.

What is claimed is:

1. A multi-stack memory device comprising:
   a storage unit group including a plurality of storage units that are vertically stacked and form a plurality of storage unit rows; and
   a plurality of transistors connected to the storage unit group,
   wherein the transistors that are connected to the storage units which are included in at least two rows of the plurality of the storage unit rows are connected by a common wire, and
   wherein the plurality of storage units are connected to the plurality of transistors in a one-to-one manner.

2. The multi-stack memory device of claim 1, wherein the common wire is a gate line.

3. The multi-stack memory device of claim 1, wherein the common wire is a bit line.

4. The multi-stack memory device of claim 1, wherein the plurality of storage units of the storage unit group are grouped into storage unit groups each having two storage unit rows, and the storage units that belong to each of the storage unit groups are connected to the transistors, which are connected by the common wire.

5. The multi-stack memory device of claim 4, wherein the storage unit group is a storage node group having domain wall movement characteristics.

6. The multi-stack memory device of claim 5, wherein the storage node group includes first and second storage node groups that include a plurality of vertically stacked storage nodes, and
   the storage nodes of the first and second storage node groups are respectively connected to the transistors.

7. The multi-stack memory device of claim 1, wherein the storage unit group is a first storage unit group and further includes a second storage unit group having a plurality of storage unit columns which are perpendicular to the first storage unit group, and the plurality of storage units of the first storage unit group and the storage units of the second storage unit group are alternately stacked.

8. The multi-stack memory device of claim 7, wherein the storage unit is a resistance change layer.

9. The multi-stack memory device of claim 7, wherein each of the columns includes a plurality of vertically stacked storage units.

10. The multi-stack memory device of claim 9, wherein the storage units included in at least two storage unit columns of the plurality of storage unit columns are connected to different transistors, and the different transistors are connected by a different common wire.

11. The multi-stack memory device of claim 10, wherein the different common wire is a gate line.

12. The multi-stack memory device of claim 10, wherein the different common wire is a bit line.

13. The multi-stack memory device of claim 7, wherein the storage units of the first storage unit group and the transistors are connected by conductive layers and conductive plugs.

14. The multi-stack memory device of claim 13, wherein diodes are formed between the conductive layers and the storage units of the second storage unit group.

15. The multi-stack memory device of claim 7, wherein a wire is formed under each of lowermost storage units of the storage units that belong to the first and second storage unit groups, and a diode is formed between the wire and the lowermost storage units.

16. The multi-stack memory device of claim 7, wherein the common wire that connects the transistors is a gate line.

17. The multi-stack memory device of claim 7, wherein the common wire that connects the transistors is a bit line.

18. The multi-stack memory device of claim 1, further comprising:
   a data line group including a plurality of data lines that are vertically stacked and form a plurality of data line columns which are perpendicular to the storage unit group, wherein the storage units of the storage unit group and the data lines of the data line group are alternately stacked.

19. The multi-stack memory device of claim 18, wherein the storage units and the transistors are connected by word lines formed on the storage units and conductive plugs, or by the word lines formed on the storage units, conductive plugs, and conductive layers.

20. The multi-stack memory device of claim 19, wherein the word lines are longer in an upward direction.

21. The multi-stack memory device of claim 19, wherein the word lines are longer in a downward direction.

22. The multi-stack memory device of claim 18, wherein the common wire that connects the transistors is a gate line.

23. The multi-stack memory device of claim 18, wherein the common wire that connects the transistors is a bit line.

24. The multi-stack memory device of claim 18, wherein the data lines included in at least two data line columns of the plurality of data line columns are connected to different transistors and the different transistors are connected by a different common wire.

25. The multi-stack memory device of claim 24, wherein the different common wire that connects the transistors is a gate line.

26. The multi-stack memory device of claim 24, wherein the different common wire that connects the transistors is a bit line.

27. The multi-stack memory device of claim 18, wherein the data lines are longer in an upward direction.

28. The multi-stack memory device of claim 18, wherein the data lines are longer in a downward direction.

29. The multi-stack memory device of claim 1, wherein the storage units are gradually longer in an upward direction.

30. The multi-stack memory device of claim 1, wherein the storage units are gradually longer in a downward direction.

31. The multi-stack memory device of claim 1, wherein the storage unit has a width of 1F, and source and drain regions of the transistor has a dimension of 1F×1F.

32. The multi-stack memory device of claim 1, wherein the storage unit has a width of about 1F, and source and drain regions of the transistor has a dimension of about 1F×about 3F.

33. The multi-stack memory device of claim 1, wherein at least some of the storage units are connected to corresponding transistors by at least one conductive layer and at least two conductive plugs.

34. The multi-stack memory device of claim 33, wherein the conductive layer has a straight line shape.

35. The multi-stack memory device of claim 33, wherein the conductive layer has a bent shape.

36. The multi-stack memory device of claim 1, wherein some of the storage units are connected to corresponding transistors by a single conductive plug.

37. The multi-stack memory device of claim 1, wherein the storage unit has a width of about 1F, and a gap between the storage units is about 1F.

38. The multi-stack memory device of claim 1, wherein the common wire is a common bit line, the common bit line includes a first portion having a straight line shape and second portions extending from the first portion in a perpendicular direction to the first portion, and the number of the second portions is the same as the number of transistors.

39. The multi-stack memory device of claim 1, wherein the common wire is a common bit line, and the common bit line has a winding shape.

40. A multi-stack memory device comprising:
a storage unit group including a plurality of storage units that are vertically stacked and form a plurality of storage unit rows; and
a plurality of transistors connected to the storage unit group,
wherein the transistors that are connected to the storage units which are included in at least two rows of the plurality of the storage unit rows are connected by a common wire, and
wherein the common wire is a gate line.

41. A multi-stack memory device comprising:
a storage unit group including a plurality of storage units that are vertically stacked and form a plurality of storage unit rows; and
a plurality of transistors connected to the storage unit group,
wherein the transistors that are connected to the storage units which are included in at least two rows of the plurality of the storage unit rows are connected by a common wire, and
wherein the storage unit group is a storage node group having domain wall movement characteristics.

* * * * *